United States Patent [19]

Robertson

[11] Patent Number: 4,587,421

[45] Date of Patent: May 6, 1986

[54] PHOTO-OPTIC TRANSDUCING HEAD ASSEMBLY

[75] Inventor: David K. Robertson, Mound, Minn.

[73] Assignee: HEI, Inc., Victoria, Minn.

[21] Appl. No.: 601,921

[22] Filed: Apr. 19, 1984

[51] Int. Cl.[4] .................... H01J 5/02

[52] U.S. Cl. .................... 250/239; 250/222.1

[58] Field of Search .................... 250/239, 227, 221, 222.1

[56] References Cited

U.S. PATENT DOCUMENTS

| | | | |
|---|---|---|---|
| 3,953,730 | 4/1976 | Henry et al. | 250/227 |
| 3,963,920 | 6/1976 | Palmer | 250/239 |
| 4,427,879 | 1/1984 | Becher et al. | 250/227 X |

*Primary Examiner*—John P. McIntosh

*Attorney, Agent, or Firm*—Orrin M. Haugen; Thomas J. Nikolai

[57] ABSTRACT

A photo-optic transducer assembly comprising a frame constructed to surround the peripheral edges of a ceramic hybrid circuit card such that a radiation source and a radiation responsive element coupled to said hybrid circuit card are appropriately aligned with a photo-optic light pipe assembly, also supported by said frame, the light pipe element leading to a location where sensing is to occur. The hybrid circuit card contains active and passive components (including one or more integrated circuit chips) on it for processing signals indicative of conditions being irradiated by a source of radiant energy.

14 Claims, 1 Drawing Figure

82 106 108 110 114 124 100 104 116 126 90 128 120 122 92 98 88 94 130 106 118 112 86 96 104 84 102

PHOTO-OPTIC TRANSDUCING HEAD ASSEMBLY

BACKGROUND OF THE INVENTION

I. Field of the Invention

This invention relates generally to photoelectric transducing systems, and more specifically to the construction of a small, compact, rugged assembly which can be used as a module in a variety of products where a light source and light sensor are to be coupled to analog circuits or to analog/digital hybrid circuits.

II. Discussion of the Prior Art

In the digital data processing field as well as in electric control systems, it is often desirable to sense the passage of some indicia on a carrier past a fixed location. For example, in document reading apparatus, such as is used in sensing information from a conventional 80-column card, photo-optic devices can be used to detect the passage of a hole or a contrasting mark. Similarly, in process control applications, it is commonly desired to detect the passage of a product along a conveyor or the edge of an object passing between supply and take-up reels. In many applications, the transducing heads are subjected to a hostile environment, requiring rugged packaging to avoid failures due to shock, vibration or contamination.

SUMMARY OF THE INVENTION

It is the purpose of the present invention to provide a novel packaging arrangement for a photo-optic transducing head in which the electrical circuitry used to generate a beam of radiant energy and/or to receive the radiant energy and convert it to an electrical pulse-type signal is disposed on or electrically coupled to a small circuit card which is adapted to be structurally supported within a rectangular frame. The frame is designed to also cooperate with a suitable "light-pipe" which is potted or otherwise embedded in a block of opaque material. The source of radiant energy (light) and the associated photo-sensor are held in proper alignment with the light-pipe which leads to a window in the working face of the block so that changes in radiant energy at this window is detected and processed by the circuitry on the circuit card. A plurality of terminal pins are bonded to the circuit card and pass through apertures formed in the frame so that the terminal pins can be inserted into appropriate jacks in a connector on a mother board.

OBJECTS

It is accordingly a principal object of the present invention to provide a new and improved photoelectric transducing head assembly.

Another object of the invention is to provide a photoelectric transducing head assembly which is rugged in its construction and protective of delicate components.

Another object of the invention is to provide a photo-optic transducing head in which the radiation source and radiation sensor are either affixed to or electrically coupled to a hybrid circuit card containing amplifiers, comparators and other circuit components commonly associated with such photoelectric devices, such hybrid circuit card being protectively contained within a frame which also provides alignment between the radiation source and sensor and a light pipe leading to the working face of the transducer.

These and other objects and advantages of the invention will become apparent to those skilled in the art from the following detailed description of a preferred embodiment, especially when considered in conjunction with the accompanying drawing.

DESCRIPTION OF THE DRAWING

The drawing shows a perspective view of a photoelectric transducing head assembly comprising the preferred embodiment.

DESCRIPTION OF THE PREFERRED EMBODIMENT

Figure 1:
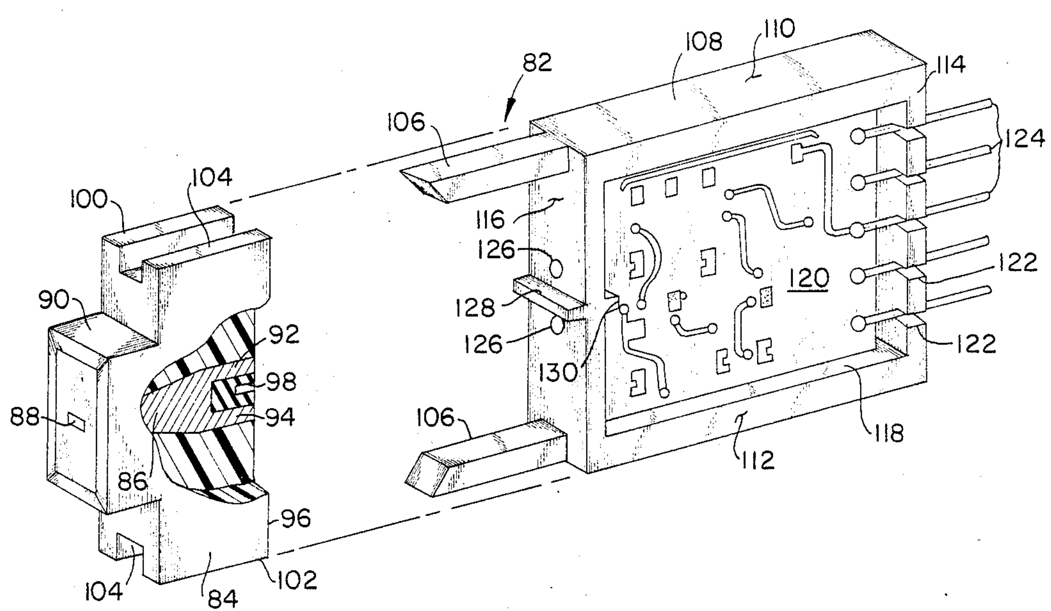

With reference to the drawing, it can be seen that the photo-optic transducing head assembly 82 comprises a block of opaque plastic material 84, such as plastic potting compound, which is molded about a bifurcated light guide which, itself, may be either a bundle of fiber-optic rods 86 a solid, molded plastic member having a suitable coating thereon such that the index of refraction at the interface causes the incident light entering one end surface of the pipe to be totally internally reflected until reaching an exit end. The stem portion of the fiber-optic bundle or light pipe is exposed through a window 88 formed centrally in a boss 90 projecting outwardly from the base of the opaque block 84. Similarly, the individual branches 92 and 94 of the bifurcated fiber-optic light pipe are exposed at spaced-apart points along the edge surface 96 of the block 84. A transversely extending slot 98 is cut into the block of opaque material between the branches 92 and 94 of the fiber-optic bundle.

In accordance with one arrangement of the invention, the side edges 100 and 102 of the opaque block 84 have longitudinal recesses 104 formed therein for receiving the projecting legs 106 of a ceramic circuit card frame member 108. The frame means 108 comprises an integrally molded structure having four mutually perpendicular side members 110 through 116 which define a rectangular opening 118 for receiving a hybrid ceramic circuit substrate 120. The side member 114 is shown to include a plurality of spaced notches 122 formed inwardly from one edge surface thereof and the spacing between the notches 122 corresponds to the spacing between the terminal pins 124 of the ceramic hybrid circuit card 120. The side member 116 opposite from the side member 114 includes a pair of spaced apertures as at 126 which serve as radiant energy transmissive windows. The spacing between these apertures or windows correspond to the spacing between the windows on the edge 96 of the block 84 through which the individual branches 92 and 94 of the fiber-optic light pipe are exposed.

Hidden from view in the drawing are a source of radiant energy, such as, for example, a light-emitting diode (LED) and a photo-transistor which is a radiant energy sensing device. The two devices are preferably located on the thin edge surface of the ceramic card 120 abutting the side 116 of the frame 106 and are spaced apart from one another by a distance which corresponds with the center-to-center spacing between the windows 126. Alternatively, the light-emitting diode and photo-transistor (not shown) can be disposed on a separate substrate and may be coupled to the circuitry on the ceramic card 120 by a suitable wire-bonding technique known in the art. In either event, when the circuit card 120 is inserted into the central opening in the frame member 108 with its terminal pins 124 extending through the notches 122 formed in the frame, the LED and the photo-transistor (neither shown) will be aligned with the apertures or windows 126. Then, when the block member 84 is secured to the frame 108 by having the extension legs 106 fitted into the longitudinal grooves 104, the LED and the photo-transistor will also be aligned with the branches 92 and 94 of the fiber-optic rod bundle or light pipe 86. Those skilled in the art will also recognize that the frame 108 and the block member 84 can be integrally formed in a molding operation and need not be separable as shown in the drawing.

The ceramic circuit card 120 contains a hybrid circuit having number of active and passive circuit components (including integrated circuit chips) along with the conductive interconnects for completing the electronic circuitry which may be energized so as to cause the LED to emit either light or invisible radiant energy, such as infra-red and for converting the radiant energy received by the photo-transistor into usable output signals.

To preclude "cross-talk", i.e., a direct transmission of radiant energy from the LED to the photo-transistor, each of which are disposed adjacent one another either on the thin side edge of the card 120 or on a separate substrate, transversely extending webs 128 and 130 are integrally molded on the side member 116 of the frame which mate with corresponding transverse slit 98 on the block 84 and a slit (unnumbered) formed in the edge of the ceramic card 120 approximately midway between the light-emitting and light-sensing devices.

In use, the photo-optic transducing head of the present invention is arranged to be plugged into a suitable electrical connector on a mother board so that the terminal pins 124 will coact with external circuits, such as voltage sources and utilization devices. As such, the requisite bias potentials will be applied, via the pins 124 and the printed wiring on the ceramic card 120, to the appropriate active and passive components also disposed on the card 120. Control potentials can also be applied to other of the terminal pins 124 for selectively energizing the radiant energy source (LED) and for setting the threshold of an integrated circuit comparator associated with the photo-transistor sensing element.

The working face of the block 84, including the window 88, will be physically positioned to "see" a transition passing thereby. For example, when the transducing head of this invention is used in a card reader, the window 88, will be positioned along a track so that a contrasting mark printed on the card or a hole punched through it will cause a change in the light intensity impinging upon the photo-transistor sensing element. If the data-bearing card has printed marks thereon, a reflective sensing technique will be employed whereas if the data is recorded by means of holes or no holes on the record member, then transmissive type photo-optic sensing may be used.

Considering first the use of the transducing head shown in the drawing in a reflective sensing mode, suitable potentials will be applied to the terminal pins 124 so as to allow the LED element (not shown) to be energized and to emit light or infra-red radiation through an aperture 126 to impinge upon the face of branch 92 or 94 of the fiber-optic light pipe 86 aligned with that aperture. The radiant energy will be transmitted through the fiber-optic rods comprising the bundle and will pass out through the window 88 so as to impinge upon the record medium. As contrasting marks printed on the medium pass the window 88, the amount of light reflected from the record medium will change. As a result, the light passing through the fiber-optic rods in the branch 92 or 94 associated with the photo-transistor (not shown) will also change and this change will be amplified and processed so as to produce a binary shift in the output from an integrated circuit comparator contained on the hybrid circuir card 120.

In the transmissive mode, two substantially identical circuits of the type shown in the figure would be used. They would be disposed on opposite sides of the travel path of the record medium to be read with the window 88 of the first such transducing head being appropriately aligned with the window 88 of the other transducing head. The external circuitry would be arranged such that only the LED device on one of the transducing heads would be activated to produce light and the other transducing head would be energized so as to have an active sensing element. Now, as a record medium having punched holes at predetermined locations passes between the two aligned transducing heads, the light emitted from window 88 of the first transducing head will, in the presence of a hole, pass through the card and through the window 88 of the receptor head, where it will pass through the fiber-optic light pipe to the semiconductor light sensing device aligned with one of the apertures 126 so as to cause a significant change in the impedance of that semiconductor element. Conversely, when the light emitted from the window 88 of the first transducing head is blocked by the presence of card material between it and the sensing transducing head, the photosensitive device will remain in a high resistance condition, yielding a different binary output.

The invention has been described herein in considerable detail, in order to comply with the patent statutes and to provide those skilled in the art with information needed to apply the novel principles, and to construct and use such specialized components as are required. However, it is to be understood that the invention can be carried out by specifically different equipment and devices, and that various modifications, both as to equipment details and operating procedures can be effected without departing from the scope of the invention itself.

What is claimed is:

1. A photoelectric transducer assembly for detecting shifts in radiant energy at a working face thereof comprising, in combination:

(a) a generally rectangular printed circuit card means having active and passive electrical components, including radiant energy source means and a radiant energy responsive means disposed thereon at spaced apart locations along a common side edge of said card;

(b) a rectangular frame member having four mutually perpendicular sidewalls defining a central opening, one of said sidewalls having spaced apart radiant energy transmissive windows;

(c) said printed circuit card means being supported within said central opening of said frame member with said radiant energy source means and said radiant energy responsive means on said common side edge of said card means being in separate alignment with said spaced apart radiant energy transmissive windows; and (d) a bifurcated radiant energy transmissive guide means secured to said frame member, the branches of said bifurcated guide means being in alignment with said spaced apart radiant energy transmissive windows; said guide means including a stem portion leading to said working face of said transducer assembly.

2. A photoelectric transducer assembly as in claim 1 wherein said printed circuit card means comprises:

(a) a ceramic substrate having a pattern of conductors on one or more surfaces thereof; and (b) said active electrical components including at least one integrated circuit chip member connected to said pattern of conductors.

3. The photoelectric transducer assembly as in claim 1 wherein said printed circuit card means includes:

(a) a plurality of terminal pins affixed thereto and extending outwardly from a side edge thereof and passing through openings formed in one of said sidewalls of said frame member when said printed circuit card means is supported within said central opening.

4. The photoelectric transducer assembly as in claim 1 wherein said radiant energy transmissive guide means comprises:

(a) a bifurcated bundle of fiber optic rods embedded in an opaque block.

5. The photoelectric transducer assembly as in claim 4 wherein said opaque block is affixed to said frame member.

6. The photoelectric transducer assembly as in claim 1 wherein said radiant energy transmissive guide means comprises:

(a) a molded, bifurcated light-pipe embedded in an opaque block.

7. The photoelectric transducer assembly as in claim 4 or 6 wherein said opaque block is separable from said frame member.

8. The photoelectric transducer assembly as in claim 1 and further including:

(a) barrier means on said frame member for preventing transmission of radiant energy from said source means to said responsive means except through said guide means.

9. The photoelectric transducer assembly as in claim 1 wherein two of said sidewalls of said rectangular frame member each include an extension projecting normally to said one of said sidewalls for receiving said guide means therebetween.

10. A photoelectric transducing head assembly comprising, in combination:

(a) a hybrid electronic circuit disposed on a ceramic substrate, said circuit including active and passive components, including a light-emitting diode and a photo-transistor disposed at spaced apart locations proximate a side edge of said substrate, said components being interconnected by a pattern of printed conductors on said substrate;

(b) a plurality of regularly spaced terminal pins connected at one end to said pattern of printed conductors on said substrate and extending from another side edge of said substrate; and (c) a generally rectangular frame member having four sidewalls defining a central opening for receiving said ceramic substrate therein, said frame member having a plurality of regularly spaced notches along one sidewall for receiving said plurality of terminal pins when said ceramic substrate is fitted into said frame, another sidewall of said frame member including light transmissive paths therethrough in alignment with said spaced apart locations.

11. The photoelectric transducing head of claim 10 and further including a light transmissive light-pipe having a common stem portion and two bifurcated arms, said arms individually joined to said spaced apart light transmissive paths in said another of said sidewalls.

12. The photoelectric transducing head of claim 11 wherein said light-pipe is embedded in a block of opaque material.

13. The photoelectric transducing head of claim 12 wherein said block of opaque material is integrally formed on said another of said side walls ofsaid frame member.

14. The photoelectric transducing head of claim 12 wherein said block of opaque material is separable from said frame member.

* * * * *